(12) United States Patent
Kim

(10) Patent No.: US 6,344,683 B1
(45) Date of Patent: Feb. 5, 2002

(54) STACKED SEMICONDUCTOR PACKAGE WITH FLEXIBLE TAPE

(75) Inventor: Sun-Dong Kim, Choongcheongbuk-Do (KR)

(73) Assignee: Hyundai Electronics Industries Co., Ltd., Ichnon-shi (KR)

( * ) Notice: Subject to any disclaimer, the term of this patent is extended or adjusted under 35 U.S.C. 154(b) by 0 days.

(21) Appl. No.: 09/393,184

(22) Filed: Sep. 10, 1999

(30) Foreign Application Priority Data

Sep. 9, 1999 (KR) ............................................. 99/7745

(51) Int. Cl.[7] ............................................. H01L 21/48
(52) U.S. Cl. ...................... 257/686; 257/676; 257/690; 257/777; 257/778; 257/779; 257/780; 257/781; 257/783
(58) Field of Search ................................ 257/676, 686, 257/690, 777–781, 783

(56) References Cited

U.S. PATENT DOCUMENTS

| | | | |
|---|---|---|---|
| 5,377,077 A | 12/1994 | Burns | 361/704 |
| 5,446,620 A | 8/1995 | Burns et al. | 361/704 |
| 5,463,253 A * | 10/1995 | Waki et al. | 257/783 |
| 5,815,372 A * | 9/1998 | Gallas | 257/783 |
| 5,933,712 A * | 8/1999 | Bernhardt et al. | 438/125 |
| 5,995,379 A * | 11/1999 | Kyougoku et al. | 257/777 |
| 6,005,292 A * | 12/1999 | Roldan et al. | 257/777 |

\* cited by examiner

Primary Examiner—Fetsum Abraham
(74) Attorney, Agent, or Firm—Fleshner & Kim, LLP

(57) ABSTRACT

A stacked semiconductor package is formed by forming a semiconductor wafer having a plurality of semiconductor chips with chip pads on their upper sides, where the chips are arranged in pairs; sawing the wafer along edges of the semiconductor chips; adhering a bonding tape to adjacent pairs of the semiconductor chips, wherein conductive interconnections on the bonding tape electrically couple corresponding chip pads of adjacent chips; cutting the bonding tape so that only adjacent pairs of the chips remain attached to one another; and stacking the adjacent pairs of semiconductor chips so that the upper sides of the chips are substantially parallel. The method may include an additional step of adhering a plurality of solder balls on the bonding tape to serve as external leads of the package. Further, the adjacent pairs of semiconductor chips may be attached to opposite sides of a heat conducting plate which serves to dissipate heat generated by the chips.

44 Claims, 5 Drawing Sheets

US 6,344,683 B1

STACKED SEMICONDUCTOR PACKAGE WITH FLEXIBLE TAPE

BACKGROUND OF THE INVENTION

1. Field of the Invention

The present invention relates to a stacked semiconductor package, and a fabricating method thereof.

2. Background of the Related Art

FIGS. 1A through 1D illustrate an example of a background art method of forming stacked semiconductor packages. FIG. 1A shows a cross-sectional view of an upper thin small outline (TSO) package 1 and a lower TSO package 2, each TSO package being fabricated by packaging two semiconductor chips with a molding resin. Outer leads 3 are formed on outer ends of each TSO package 1, 2. Those TSO packages 1, 2 can be distinguished by the shape of their outer leads 3. As a result of a stacking process, a plurality of leads 3 are formed on opposite sides of the upper and lower TSO packages 1, 2.

FIG. 1B shows the upper TSO package 1 stacked to an upper side of the lower TSO package 2. A nipper 4 picks up the stacked TSO packages 1, 2, as shown in FIG. 1C, and the leads 3 are dipped in a solder solution 5 in a vessel 6 such that a connecting portion of the outer leads 3 of the stacked TSO packages 1, 2 is covered with the solder solution 5. The solder solution 5 is heated to its boiling point at approximately 250° C. To prevent the plurality of outer leads 3 from inadvertently contacting one another, each outer lead is soldered separately. During the soldering process, the outer leads 3 of the TSO packages 1, 2 are dipped in the solder solution 5 or smeared with drops splashed from the boiling solder solution 5. The stacked TSO package is completed once the solder solution at the outer leads 3 of the upper and lower TSO packages 1, 2 is made to reflow, as illustrated in FIG. 1D.

The background art method has various disadvantages. It is difficult to control the amount of solder solution which contacts the stacked TSO package, because the outer leads are dipped in the solder solution or smeared with the drops splashed from the boiling solder solution. In addition, when a plurality of the outer leads are densely packed together, it is more difficult to separately dip each outer lead in the solder solution, and short-circuiting can result when adjacent outer leads are connected to one another by the solder solution.

SUMMARY OF THE INVENTION

It is an object of the present invention to provide a method of forming a stacked semiconductor package, similar in size to a semiconductor chip, which is easier to perform than background art methods.

It is also an object of the present invention to provide a method of forming a stacked semiconductor package which can prevent short-circuiting that can occur when terminals are inadvertently connected to one another.

A stacked semiconductor package embodying the present invention includes first and second semiconductor chips having first sides, wherein a plurality of chip pads are formed on the first sides of the chips, and a bonding tape is adhered to the first and second chips, the bonding tape having conductive interconnections that couple corresponding chip pads of the first and second semiconductor chips. A package embodying the invention may also include a plurality of conductive media which are used to couple the chip pads to external devices. A package embodying the invention may be configured such that the first sides of the chips are substantially parallel to one another with the first sides being arranged on either the external sides of the package, or so that they face one another inside the package. A heat conducting plate may also be connected between the first and second chips.

A device embodying the invention may also comprise a bonding tape for joining two semiconductor chips. The bonding tape would include a flexible adhesive layer configured so that it can be adhered to first surfaces of first and second semiconductor chips to attach the chips to each other. The bonding tape would also include a plurality of conductive regions formed on the adhesive layer such that when the adhesive layer is adhered to the first and second semiconductor chips, the conductive regions will electrically couple chip pads on the first semiconductor chip to corresponding chip pads on the second semiconductor chip.

A method embodying the invention includes the steps of attaching a first semiconductor chip to a second semiconductor chip using a bonding tape that adheres to first surfaces of the chips, wherein conductive interconnections on the bonding tape also electrically couple corresponding chip pads formed on the chips. The method also includes bending the bonding tape such that the first surfaces of the first and second semiconductor chips are arranged substantially parallel to one another. A method of bonding the invention can also include a step of attaching a plurality of conductive media to the conductive interconnections on the bonding tape such that the plurality of conductive media can serve as external leads of the package.

An alternative method of forming a stacked semiconductor package, embodying the invention, includes a first step of sawing a wafer on which a plurality of semiconductor chips are arranged in pairs to separate the wafer into a plurality of chips; adhering a bonding tape to the chips so that the bonding tape attaches adjacent pairs of chips to one another, and so that conductive interconnections on the bonding tape electrically connect respective chip pads of adjacent pairs of the chips; cutting the bonding tape; and stacking the pairs of semiconductor chips so that they face each other. Some methods embodying the invention may include an additional step of adhering conductive media to the bonding tape. Also, the wafer may be attached to an adhesive mounting foil before the wafer is cut into individual chips.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein:

FIG. 2A shows a perspective view of two semiconductor chips prior to stacking, FIGS. 2B and 2C show plan views of a wafer, and FIG. 2D shows a plan view of the two semiconductor chips prior to stacking;

DETAILED DESCRIPTION OF PREFERRED EMBODIMENTS

Figure 1A:
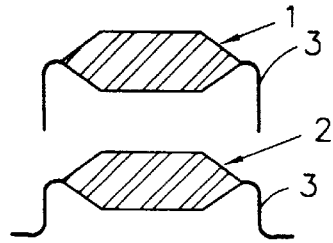
FIGS. 1A through 1D illustrate a background art fabricating process for a stacked TSO package.
Figure 1B:
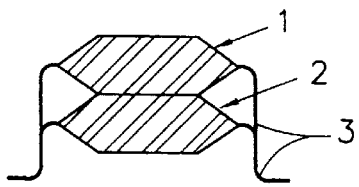
Figure 1C:
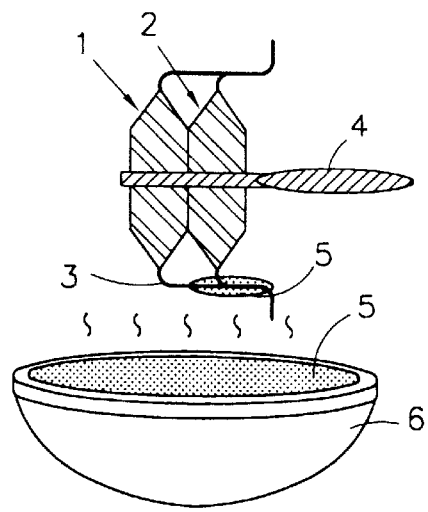
Figure 1D:
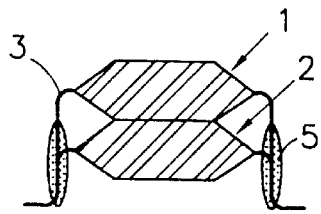
Figure 2A:
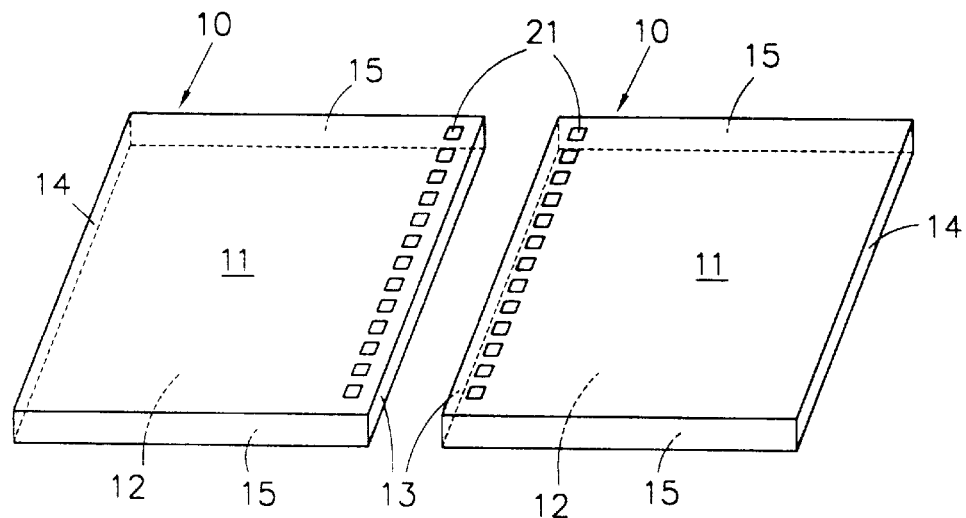
FIGS. 2A through 2D illustrate a fabricating process for a stacked semiconductor package according to the present invention, where

FIGS. 2A through 2D illustrate a fabricating process of a stacked semiconductor package according a preferred embodiment of the present invention. FIG. 2A shows a perspective view of two semiconductor chips 10 prior to stacking. A plurality of chip pads 21 are formed on first sides 11 of the pair of semiconductor chips 10. Additionally, the semiconductor chips 10 are configured to have a second side 12 opposite to the first side 11, a near side edge 13 adjacent to the chip pads 21, and a far side edge 14 opposite the chip pads 21. The near and far side edges 13, 14 run parallel to a forming direction of the chip pads 21, while top and bottom side edges 15 run perpendicular to the forming direction of the chip pads 21.

Figure 2B:
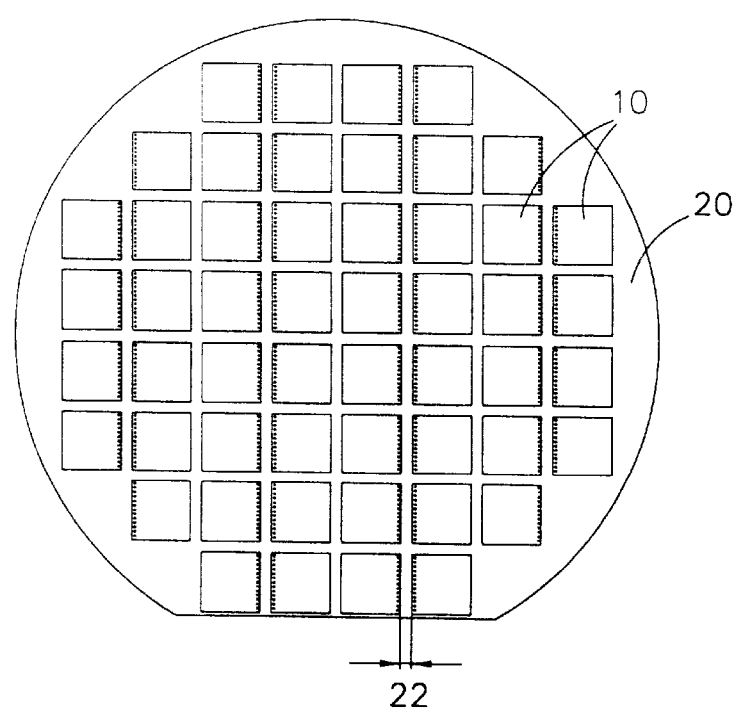

FIG. 2B shows a plurality of semiconductor chips 10 configured on a first side of a wafer 20. The chips are formed such that the chip pads 21 of adjacent pairs of chips 10 are adjacent to each other. The wafer 20 is positioned on an adhesive mounting foil (not shown).

Figure 3A:
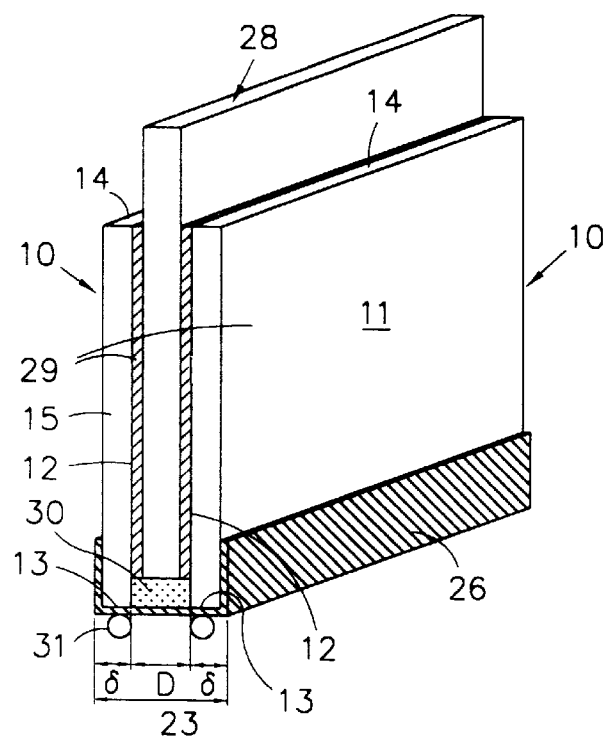
FIG. 3A illustrates a perspective view of a stacked semiconductor package according to a first embodiment of the present invention.
Figure 3B:
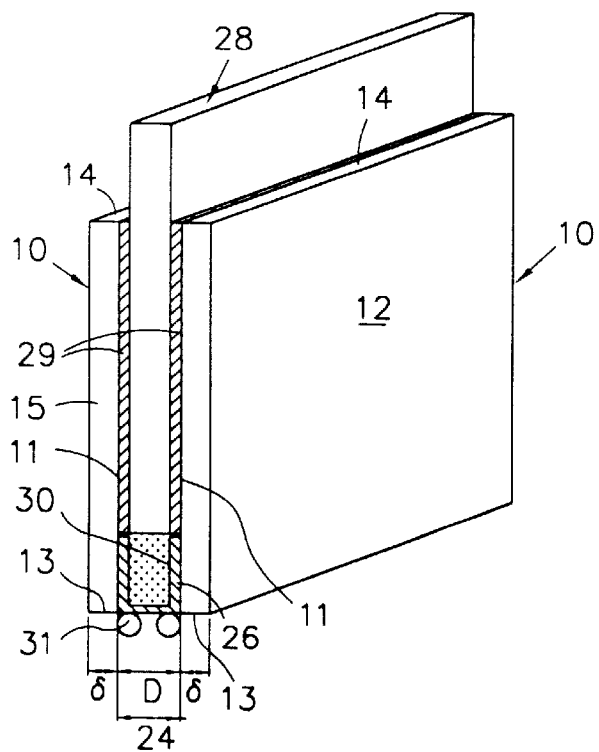
FIG. 3B illustrates a perspective view of a stacked semiconductor package according to a second embodiment of the present invention.

To form a package embodying the invention, the wafer 20 must be cut at a thickness equal to a desired distance 22 between the semiconductor chips 10. The wafer 20 on the mounting foil is cut along the boundaries of the respective semiconductor chips 10. The adjacent pairs of chips can be stacked together in different ways, and the stacking method dictates the thickness 22 of the cut between adjacent chips. The distance 22 between a pair of semiconductor chips 10 may equal a distance 23, or a distance 24, as shown in FIG. 3A and FIG. 3B. After cutting, the adhesive mounting foil prevents the semiconductor chips 10 from moving relative to one another, and thus maintains the shape of the wafer 20. As a result, it is easier to adhere a bonding tape to pairs of the semiconductor chips 10, as discussed in more detail below.

Figure 2C:
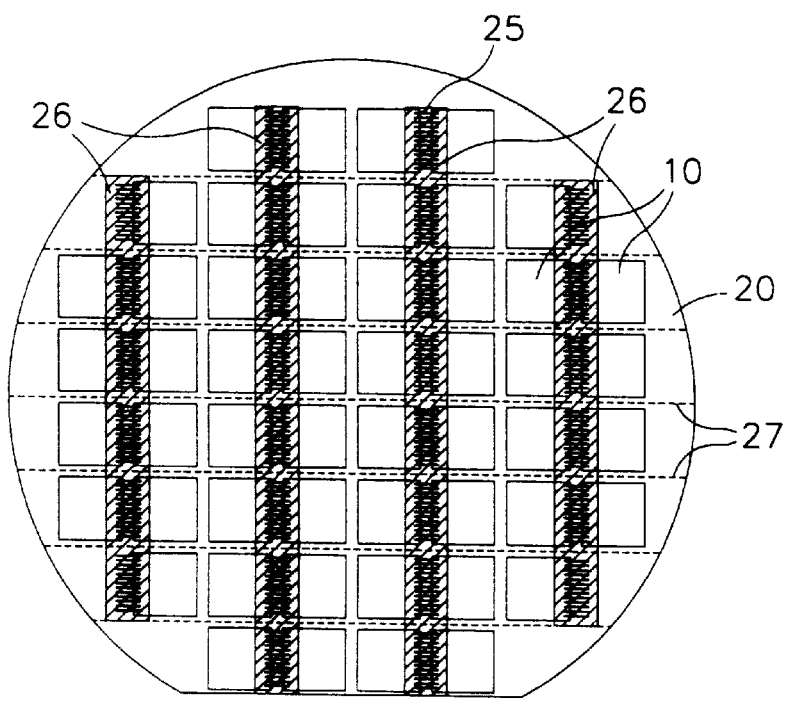

FIG. 2C illustrates a tape-automated bonding (TAB) process. A bonding tape 26 is adhered between pairs of semiconductor chips 10. The bonding tape 26 is attached to the first sides of the chips 20 such that conductive interconnections 25 formed on one side of the bonding tape 26 connect corresponding chip pads 21 of adjacent pairs of chips 10. Next, the bonding tape 26 is cut along cutting lines 27, and each pair of semiconductor chips 10 is separated from the mounting foil.

Figure 2D:
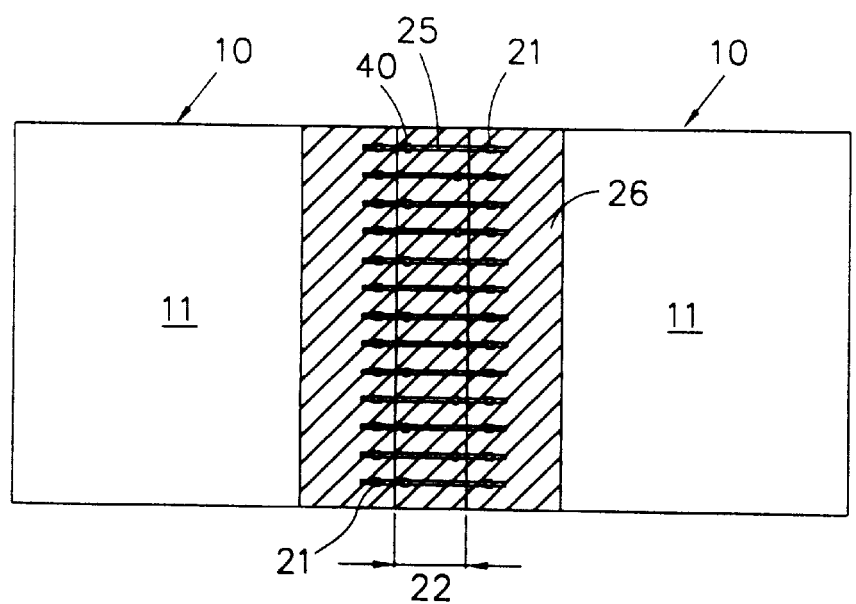

FIG. 2D shows an enlarged plan view of a pair of semiconductor chips 10 after separation from the mounting foil, and before stacking has been completed. Corresponding chip pads 21 of the two chips 10 are electrically connected by the conductive interconnections 25, formed on the bonding tape 26. Predetermined regions 40 of the conductive interconnections 25 may be silver-plated. Solder balls 31 or other conductive media can then be mounted at those plated regions 40.

In the embodiment shown in FIG. 2D, the plated regions 40 are configured in an alternating pattern so that one solder ball can be attached to each conductive interconnection 25, and so that the solder balls are spread apart when the package is completed. The silver plating electrically connects the adhesive and non-adhesive sides of the bonding tape 26. Accordingly, when the conductive interconnections 25 formed on the adhesive side of the bonding tape 26 are connected with the respective chip pads 21 formed on the semiconductor chips 10, the chip pads 21 can transmit electrical signals to solder balls attached to the plated regions 40 via the conductive interconnections 25. The solder balls function as outer terminals. Of course, other types of conductive media could be used in place of the solder balls.

An attached pair of semiconductor chips 10 is stacked by bending the bonding tape 26 twice in a perpendicular manner such that the first sides 11 of the chips 10 run parallel to each other. The arrangement of stacked semiconductor package may be varied by bending the bonding tape 26 in different directions.

FIG. 3A shows a first embodiment of the present invention where the first sides 11, and thus the chip pads 21, are externally positioned. After the bonding tape 26 is bent such that the first sides 11 of the pair of semiconductor chips 10 are externally exposed, a plate 28 is adhered between the pair of semiconductor chips 10 using a non-conductive two-sided adhesive tape 29, thereby stacking the semiconductor chips 10.

As described above, when the first sides 11 are externally positioned after the bonding tape 26 has been bent perpendicularly twice, the near side edges 13 of the semiconductor chips 10 are in contact with the bonding tape 26. The plate 28 is adhered using the non-conductive two-sided adhesive tape 29 on the second sides 12 of the semiconductor chips 10.

The plate 28 attached to the second sides 12 of the semiconductor chips 10 may leave a predetermined space between an end of the plate 28 and the conductive interconnections 25 of the bonding tape 26. A liquid-phase epoxy molding compound 30 is injected into that predetermined space. The bonding tape 26 thus adheres to the near side edges 13 of the semiconductor chips 10 and the epoxy molding compound 30, in addition to the chip pads 21 and first sides 11. Solder balls 31, or other types of conductive media, are then positioned on the outer surface of the bonding tape 26.

FIG. 3B shows a second preferred embodiment of the present invention where the first sides 11 and the chip pads 21 of the pair of semiconductor chips 10 are internally positioned. After the bonding tape 26 is bent such that the second sides 12 are externally exposed, the plate 28 is adhered between the pair of semiconductor chips using a non-conductive two-sided adhesive tape 29, thereby stacking the semiconductor chips 10.

The plate 28 attached to the first sides 11 of the semiconductor chips 10 leaves a predetermined space between the plate 28 and the conductive interconnections 25 of the bonding tape 26. A liquid-phase epoxy molding compound 30 is injected into the predetermined space. Solder balls 31 are then attached to the exposed surface of the bonding tape 26.

In the first and second preferred embodiments of the present invention, the plate 28 helps to discharge heat generated from operation of the semiconductor chips 10. The plate 28 may be made of metal, or any other material that readily conducts heat. The plate may be between about 0.1 mm and about 0.3 mm thick, which is approximately the thickness of the semiconductor chips 10. A portion of the plate 28 is externally exposed when the pair of semiconductor chips 10 are stacked. The length of the exposed portion is determined based on the heat discharge efficiency and the size of the stacked semiconductor package. Thus, a larger exposed portion of the plate 28 from the stacked semiconductor chips 10 corresponds to a higher efficiency of heat discharge. However, the size of the stacked semiconductor package increases.

In addition, the distance 22 between pairs of semiconductor chips formed on a wafer (see FIG. 2B) equals a distance 23, 24 between the first sides 11 of the semiconductor chips 10 after the package has been formed. Thus, that distance 22 is different in the first and second preferred embodiments of the present invention.

The semiconductor chip 10 thickness is represented by 'δ' and the thickness of the metal plate 28 and the non-conductive two-side adhesive tape 29 is represented by 'D.' In the first preferred embodiment of the present invention, the distance 22 between a pair of semiconductor chips 10 on the wafer 20 equals the distance (D+2δ) 23 between the first sides 11 of the semiconductor chips 10 in the fabricated stacked semiconductor package, as shown in FIG. 3A. However, in the second preferred embodiment of the present invention, the distance 22 between a pair of semiconductor chips 10 on the wafer 20 equals the distance (D) 24 between the first sides 11 of the pair of semiconductor chips 10 in the fabricated stacked semiconductor package, as shown in FIG. 3B. Therefore, the distance 24 according to the second preferred embodiment is less than the distance 23 according to the first embodiment.

Figure 3C:
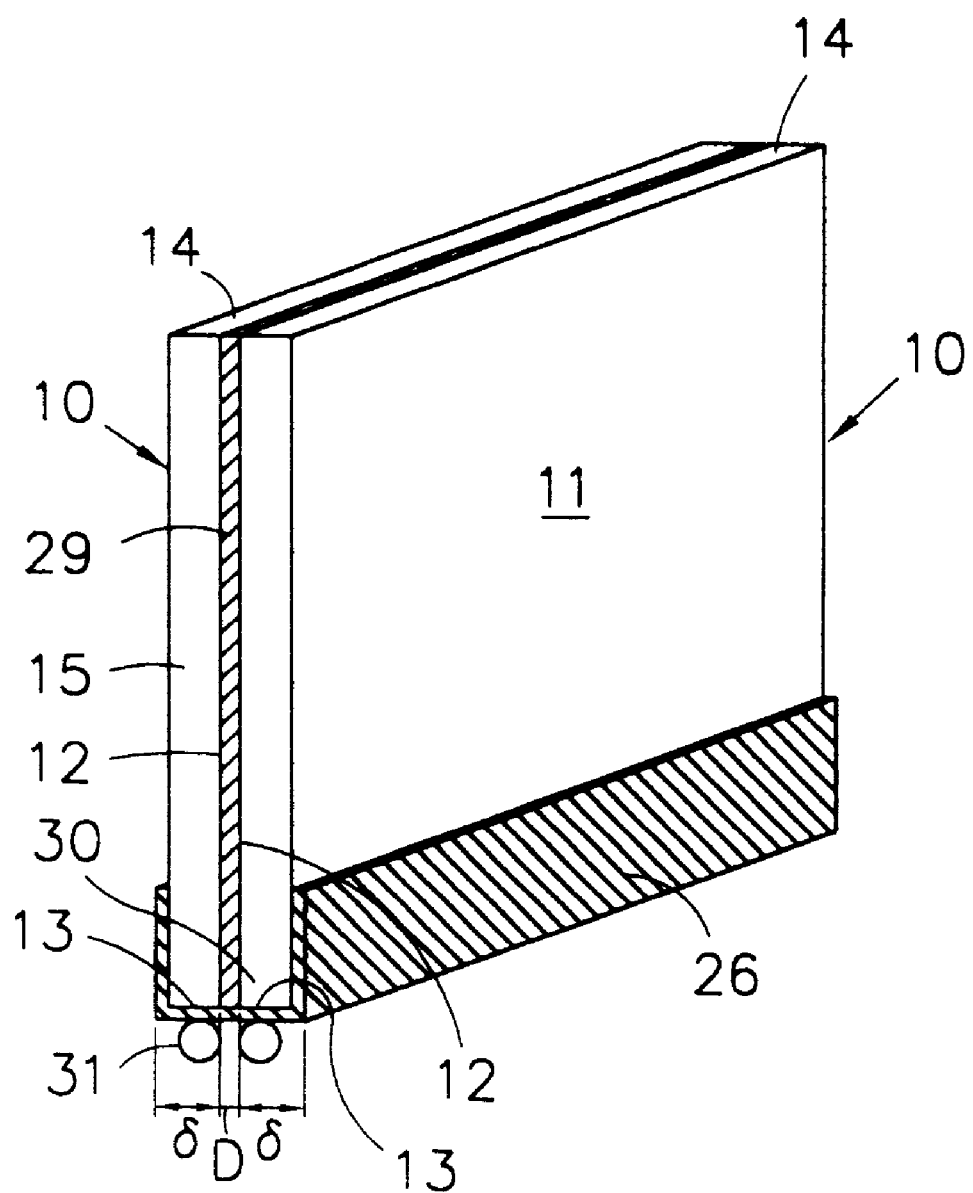
FIG. 3C illustrates a perspective view of a stacked semiconductor package according to a third embodiment of the present invention.

FIG. 3C shows a third preferred embodiment of the present invention. In this embodiment, the pair of semiconductor chips 10 are stacked without using a plate, and the non-conductive two-sided adhesive tape 29 holds the chips 10 together, and prevents the chips 10 from contacting one another. Thus, the stacked semiconductor package can be made smaller and thinner due to the reduced distance D between die adjacent semiconductor chips 10. Additionally, the bonding tape 26 does not require separation from a plate, and thus, the step of injecting an epoxy molding compound between the plate and bonding tape is eliminated. However, the heat discharge efficiency is decreased. The solder balls 31, which serve as outer terminals, are then mounted on the silver-plated predetermined regions 40 of the bonding tape 26, thus completing the stacked semiconductor package fabrication process.

An additional embodiment of the invention, similar to the one shown in FIG. 3C, could also be made by stacking two semiconductor chips 10 such that their first sides 11 are located internally and face one another. This embodiment would have its chips 10 arranged as shown in FIG. 3B, except the chips would be directly attached to one another with a double sided adhesive. This embodiment would not have the plate 28 shown in FIG. 3E.

A stacked semiconductor package embodying the present invention has various advantages. Attaching the semiconductor chips using one-sided adhesive bonding tape with the conductive interconnections simplifies the process of attaching the chips to each other, and of coupling corresponding chip pads. Thus, the present invention obviates the disadvantages of the background art caused by stacking and electrically connecting the semiconductor chips by dipping the outer leads in a solder solution, including short-circuiting of the leads.

In addition, a chip size package can be formed using a plate similar in thickness to the semiconductor chip, or by stacking the semiconductor chips without the plate. Use of the plate helps to discharge heat generated by the semiconductor chips, thus improving heat discharge efficiency.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although solder balls and metal leads may not be structural equivalents in that a solder ball has a lower melting point and smaller external dimensions than a metal lead, in the environment of providing electrical connections to a chip package, a solder ball and a metal lead may be equivalent structures.

What is claimed is:

1. A semiconductor package, comprising:
   first and second semiconductor chips, each having a first side, wherein a plurality of chip pads are formed on the first side of each of the semiconductor chips, and wherein the first and second semiconductor chips are oriented such that the first sides are internally positioned and face one another; and
   a flexible bonding tape attached to the first sides of the first and second semiconductor chips, wherein conductive interconnections of the flexible bonding tape electrically couple respective ones of the chip pads on the first and second semiconductor chips, and wherein a portion of the bonding tape not adhered to the first and second semiconductor chips is externally exposed.

2. The package according to claim 1, further comprising a heat conducting plate positioned between and attached to the first and second semiconductor chips.

3. The semiconductor package of claim 2, further comprising non-conductive adhesive layers that attach the first and second semiconductor chips to opposite sides of the heat conducting plate.

4. The semiconductor package of claim 2, wherein the heat conducting plate is positioned between the first and second semiconductor chips so that it does not contact the flexible bonding tape.

5. The semiconductor package of claim 2, further comprising a molding compound that is positioned in a space between the flexible bonding tape, the first and second semiconductor chips, and the heat conducting plate.

6. The semiconductor package of claim 1, wherein portions of the plurality of conductive interconnections of the flexible bonding tape are plated with an electrically conductive material.

7. The semiconductor package of claim 6, wherein the electrically conductive material is silver.

8. The semiconductor package of claim 1, further comprising a plurality of conductive media that are attached to the flexible bonding tape, and that form external leads of the package.

9. The semiconductor package of claim 8, wherein the conductive media are solder balls.

10. A semiconductor package, comprising:
    first and second chips having first and second surfaces, wherein the chips are oriented such that the first surfaces are externally positioned and the second surfaces are internally positioned to face each other; and
    a flexible adhesive having conductive portions that electrically couples the first surfaces of the first and second chips at predetermined coupling regions.

11. The semiconductor package of claim 10, wherein the flexible adhesive is electrically isolated from the second surfaces of the first and second chips.

12. The semiconductor package of claim 10, wherein the flexible adhesive is a bonding tape.

13. The semiconductor package of claim 10, wherein the predetermined coupling regions are chip pads.

14. The semiconductor package of claim 10, further comprising a plurality of external leads formed on the conductive portions of the flexible adhesive, wherein the plurality of external leads are electrically conductive media.

15. The semiconductor package of claim 14, wherein the electrically conductive media are solder balls.

16. The semiconductor package of claim 10, wherein the conductive portions are conductive interconnections.

17. The semiconductor package of claim 16, wherein the conductive interconnections are plated with all electrically conductive material.

18. The semiconductor package of claim 10, further comprising a heat conductor that is positioned between the first and second chips.

19. The semiconductor package of claim 18, further comprising an insulating adhesive that attaches the heat conductor to one of the first and second sides of the first and second chips.

20. The semiconductor package of claim 18, wherein the heat conductor is a heat conducting plate.

21. The semiconductor package of claim 18, wherein the heat conductor is not in contact with the flexible adhesive.

22. The semiconductor package of claim 21, further comprising a molding compound that is positioned between the heat conductor, the first and second chips and the flexible adhesive.

23. A semiconductor package, comprising:
   first and second semiconductor chips, each having a first side, wherein a plurality of chip pads are formed on the first side of each of the semiconductor chips;
   a bonding tape attached to the first sides of the first and second semiconductor chips, wherein conductive interconnections of the bonding tape electrically couple respective ones of the chip pads on the first and second semiconductor chips; and
   a heat conducting plate positioned between and attached to the first and second semiconductor chips.

24. The semiconductor package of claim 23, wherein the first and second semiconductor chips are positioned such that the first sides of each of the semiconductor chips are internally positioned, and wherein a portion of the bonding tape not adhered to the first and second semiconductor chips is externally exposed.

25. The semiconductor package of claim 23, wherein the first and second semiconductor chips are positioned such that the first sides of each of the semiconductor chips is externally exposed, and wherein portions of the bonding tape adhered to the first and second semiconductor chips are externally exposed.

26. The semiconductor package of claim 23, further comprising non-conductive adhesive layers that attach the first and second semiconductor chips to opposite sides of the heat conducting plate.

27. The semiconductor package of claim 23, wherein the heat conducting plate is positioned between the first and second semiconductor chips so that it does not contact the bonding tape.

28. The semiconductor package of claim 23, further comprising a molding compound that is positioned in a space between the bonding tape, the first and second semiconductor chips, and the heat conducting plate.

29. The semiconductor package of claim 23, further comprising a plurality of conductive media that are attached to the bonding tape, and that form external leads of the package.

30. The semiconductor package of claim 29, wherein the conductive media are solder balls.

31. A semiconductor package, comprising:
   first and second semiconductor chips, each having a first side and a second opposite side, wherein a plurality of chip pads are formed on the first side of each of the semiconductor chips, and wherein the first and second semiconductor chips are oriented such that the second sides of each are internally positioned to face one another; and
   a flexible bonding tape attached to the first sides of the first and second semiconductor chips, wherein conductive interconnections of the bonding tape electrically couple respective ones of the chip pads on the first and second semiconductor chips, and wherein portions of the bonding tape adhered to the first and second semiconductor chips are externally exposed.

32. The package according to claim 31, further comprising a heat conducting plate positioned between and attached to the first and second semiconductor chips.

33. The semiconductor package of claim 32, further comprising a molding compound that is positioned in a space between the bonding tape, the first and second semiconductor chips, and the heat conducting plate such that the heat conducting plate does not contact the bonding tape.

34. The semiconductor package of claim 31, further comprising a plurality of conductive media that are attached to the bonding tape, and that form external leads of the package.

35. The semiconductor package of claim 34, wherein the conductive media are solder balls.

36. A semiconductor package, comprising:
   first and second chips having first and second opposite surfaces oriented such that the second surfaces of the chips are externally positioned and the first surfaces are internally positioned to face each other; and
   a flexible adhesive having conductive portions that electrically couple the first surfaces of the first and second chips at predetermined coupling regions.

37. The semiconductor package of claim 36, wherein the flexible adhesive is a bonding tape.

38. The semiconductor package of claim 36, wherein the predetermined coupling regions are chip pads.

39. The semiconductor package of claim 36, further comprising a plurality of external leads formed on the conductive portions of the flexible adhesive, wherein the plurality of external leads are electrically conductive media.

40. The semiconductor package of claim 36, further comprising a heat conductor that is positioned between the first and second chips.

41. A semiconductor package, comprising:
   a first and a second semiconductor chip, wherein a plurality of chip pads are formed on a first side of each of the semiconductor chips;
   a heat conductive plate positioned between the first and second semiconductor chips and in contact with each of the semiconductor chips; and a flexible bonding tape comprising a plurality of conductive interconnections, wherein the flexible bonding tape is bonded to the first side of each of the semiconductor chips such that the conductive interconnections make electrical contact with corresponding ones of the plurality of chips pads of each semiconductor chip.

42. The semiconductor package of claim 41, wherein the first and a second semiconductor chip each comprise a second side, and the heat conductive plate is in contact with the second side of each of the semiconductor chips.

43. The semiconductor package of claim 41, wherein the plurality of conductive interconnections electrically connect each respective chip pad of the first semiconductor chip to a corresponding chip pad of the second semiconductor chip.

44. The semiconductor package of claim 41, wherein the heat conductive plate is in contact with the first side of each of the semiconductor chips.

* * * * *

UNITED STATES PATENT AND TRADEMARK OFFICE
CERTIFICATE OF CORRECTION

PATENT NO.    : 6,344,683 B1
DATED         : February 5, 2002
INVENTOR(S)   : Sun-Dong Kim It is certified that error appears in the above-identified patent and that said Letters Patent is hereby corrected as shown below:

<u>Title page,</u>
Item [30], should read -- March 9, (KR)...................99/7745 --.

Signed and Sealed this

Fifteenth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,344,683 B1
DATED : February 5, 2002
INVENTOR(S) : Sun-Dong Kim

It is certified that error appears in the above-identified patent and that said Letters Patent is hereby corrected as shown below:

<u>Title page,</u>
Item [30], should read -- March 9, 1999  (KR)……………...99/7745 --.

This certificate supersedes Certificate of Correction issued April 15, 2003.

Signed and Sealed this

Twenty-fourth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,344,683 B1
DATED         : February 5, 2002
INVENTOR(S) : Sun-Dong Kim It is certified that error appears in the above-identified patent and that said Letters Patent is hereby corrected as shown below:

<u>Title page,</u>
Item [30], should read -- March 9, 1999   (KR)……………...99/7745 --.

This certificate supersedes Certificate of Correction issued April 15, 2003.

Signed and Sealed this

Fifteenth Day of July, 2003

JAMES E. ROGAN
*Director of the United States Patent and Trademark Office*